United States Patent
Howard

(10) Patent No.: US 7,180,159 B2
(45) Date of Patent: Feb. 20, 2007

(54) BIPOLAR TRANSISTOR HAVING BASE OVER BURIED INSULATING AND POLYCRYSTALLINE REGIONS

(75) Inventor: Gregory E. Howard, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 76 days.

(21) Appl. No.: 10/889,878

(22) Filed: Jul. 13, 2004

(65) Prior Publication Data
US 2006/0011943 A1    Jan. 19, 2006

(51) Int. Cl.
*H01L 29/737* (2006.01)

(52) U.S. Cl. .................. 257/588; 257/197; 257/586; 257/592; 257/E29.2; 438/309; 438/348; 438/361

(58) Field of Classification Search ............ 257/197, 257/588; 438/309, 348
See application file for complete search history.

(56) References Cited

U.S. PATENT DOCUMENTS

| | | | | |
|---|---|---|---|---|
| 4,749,661 A | * | 6/1988 | Bower | 438/345 |
| 4,984,048 A | * | 1/1991 | Sagara et al. | 257/520 |
| 5,250,448 A | * | 10/1993 | Hamasaki et al. | 438/312 |
| 5,350,948 A | * | 9/1994 | Maehara | 257/763 |
| 5,391,912 A | * | 2/1995 | Horiuchi et al. | 257/588 |
| 6,656,811 B2 | * | 12/2003 | Swanson et al. | 438/320 |
| 2004/0089886 A1 | * | 5/2004 | Hattori et al. | 257/279 |

* cited by examiner

*Primary Examiner*—Thao X. Le
*Assistant Examiner*—Abul Kalam
(74) *Attorney, Agent, or Firm*—W. James Brady; Frederick J. Telecky, Jr.

(57) ABSTRACT

A bipolar transistor in a monocrystalline semiconductor substrate (101), which has a first conductivity type and includes a surface layer (102) of the opposite conductivity type. The transistor comprises an emitter contact (110) on the surface layer; a base contact (130 and 131) extending through a substantial portion (141) of the surface layer, spaced apart (140a) from the emitter; an insulator region (150/151) buried under the base contact; a collector contact (120); and a first polycrystalline semiconductor region (152/153) selectively located under the insulator region, and a second polycrystalline semiconductor region (154) selectively located under the collector contact. These polycrystalline regions exhibit heavy dopant concentrations of the first conductivity type; consequently, they lower the collector resistance.

10 Claims, 16 Drawing Sheets

BIPOLAR TRANSISTOR HAVING BASE OVER BURIED INSULATING AND POLYCRYSTALLINE REGIONS

FIELD OF THE INVENTION

The present invention is related in general to the field of electrical systems and semiconductor devices and more specifically to structure and method of a low-cost, low base/collector capacitance, high gain bipolar transistor having its base over buried insulator and polycrystalline regions.

DESCRIPTION OF THE RELATED ART

The bipolar transistor is one of the most important semiconductor devices and a fundamental building block of integrated circuits (IC), with applications in computers, vehicles, satellites, and in communication and power systems. Because of its widespread use, it is subject to the dominating on-going market trends: progressive integration of functions, downscaling of dimensions, increase of speed, power, and reliability, and last, but not least, downsizing cost.

It is common practice to propose improvements on one subject or the other, one at a time: either a technical parameter, or a commercial projection, or a manufacturing need. The International Technology Roadmap for Semiconductors ties to combine these needs and project the required innovations, focusing on MOSFETs. For instance, for leading edge logic chips, this Roadmap projects continuous rapid scaling in the physical gate length and gate dielectric equivalent oxide thickness, while the parameter characterizing the performance/speed of the MOS transistor, also called the nMOS delay time constant $\tau$, is projected to improve by its historic rate of about 17%/year. The Roadmap, though, is short of analogous technical approaches for bipolar transistors.

SUMMARY OF THE INVENTION

A need has therefore arisen to conceive a fresh concept of a coherent, low-cost methodology for fabricating bipolar, and specifically heterojunction bipolar, transistors using fewer photomasks and maintaining alignment features such as self-aligned emitter-to-base polysilicon and aligned collector. Avoiding the alignment tolerance inherent in the use of photomasks, the base resistance can be better controlled, which translates into a better control of gain and bandwidth. In addition, having the base over oxide lowers the base-to-collector capacitance and provides immunity to cosmic radiation faults.

It is a technical advantage of the new fabrication concept that it is based on fundamental design concepts, which are flexible enough to be applied for different semiconductor product families and a wide spectrum of design variations. It is another technical advantage that, due to a reduction of photomasks the process yield is enhanced, while the innovations are accomplished using the installed equipment base so that no investment in new manufacturing machines is needed.

One embodiment of the invention is a bipolar transistor in a monocrystalline semiconductor substrate, which has a first conductivity type and includes a surface layer of the opposite conductivity type. The transistor comprises an emitter contact on the surface layer; a base contact extending through a substantial portion of the surface layer, spaced apart from the emitter; an insulator region buried under the base contact; a collector contact; and a first polycrystalline semiconductor region selectively located under the insulator region, and a second polycrystalline semiconductor region selectively located under the collector contact. These polycrystalline regions exhibit heavy dopant concentrations of the first conductivity type; consequently, they lower the collector resistance.

Another embodiment of the invention is a bipolar transistor in a semiconductor substrate of a first conductivity type, including a surface layer of the opposite conductivity type and a certain sheet resistance. The transistor comprises an insulator on the surface layer, the insulator having a width and first and second sides; an emitter with a contact on the surface layer, the contact adjoining the first insulator side; a base contact extending through a substantial portion of the surface layer at the second insulator side, while the base contact is spaced from the emitter contact by the insulator width so that the product of this width and the layer sheet resistance determines the transistor base resistance; and a collector contact in the substrate so that it converts the substrate into an extended collector region.

Another embodiment of the invention is a method for fabricating a bipolar transistor, or a heterojunction bipolar transistor (HBT) comprising chemical-mechanical polishing (CMP) techniques, which can be coordinated with CMOS CMP manufacturing. The process sequence entails several CMP steps to reduce the photomask count; compared to a standard HBT process sequence of eight mask steps, the invention requires only seven mask steps. In the fabrication method, trenches are employed to accommodate the base and collector contacts. The trenches are defined by silicon carbide walls, which also serve as stoppers in the chemical-mechanical polishing process steps. Due to the straight-line geometry of the trenches, components of base and collector assembled in those trenches in consecutive order, are by necessity completely aligned. Consequently, transistor characteristics such as parasitic and transverse base resistance, and collector resistance, can be strictly controlled, resulting in devices suitable for applications requiring higher gain and bandwidth.

The fabrication method of the invention provides a buried insulator under the base, making the transistor immune to cosmic radiation faults. The method further provides buried, heavily doped polysilicon regions under the gate and collector contacts without the need for a buried layer—a significant process simplification.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 2 shows schematically the process steps of forming, on the surface of a semiconductor substrate of a first conductivity type, a layer of a semiconductor of the opposite conductivity type, and a first insulator layer comprising a stack of an oxide layer and a silicon carbide layer.

FIG. 3 shows schematically the process steps leading to the definition of the areas for the emitter, base, and collector structures and their surrounding walls.

FIG. 4 shows schematically the process steps of forming trenches for base and collector contacts.

FIG. 5 shows schematically the process steps of depositing and doping a first polycrystalline semiconductor material.

FIG. 6 shows schematically the process step of applying chemical-mechanical polishing.

FIG. 7 shows schematically the process step of partially etching the first polycrystalline semiconductor material.

FIG. 8 shows schematically the process steps of depositing, chemical-mechanical polishing, and etching second insulating material.

FIG. 9 shows schematically the process steps of masking the transistor and implanting dopants to create a collector quasi-buried layer connection.

FIG. 10 shows schematically the process steps of depositing, chemical-mechanical polishing, and etching second polycrystalline semiconductor material.

FIG. 11 shows schematically the process steps of exposing the emitter contact and depositing third polycrystalline semiconductor.

FIG. 12 shows schematically the process steps of depositing and etching line oxide and nitride to create emitter and collector sidewalls.

FIG. 13 shows schematically the process steps of masking and partially etching the base polycrystalline semiconductor material.

FIG. 14 shows schematically the process steps of masking and implanting the base polycrystalline contacts.

FIG. 15 shows schematically the process steps of depositing and etching back third insulating material to fill the base/collector gaps.

FIG. 16 shows schematically the process steps of masking and implanting the emitter and collector polycrystalline contacts.

DETAILED DESCRIPTION OF THE PREFERRED EMBODIMENTS

Figure 1:
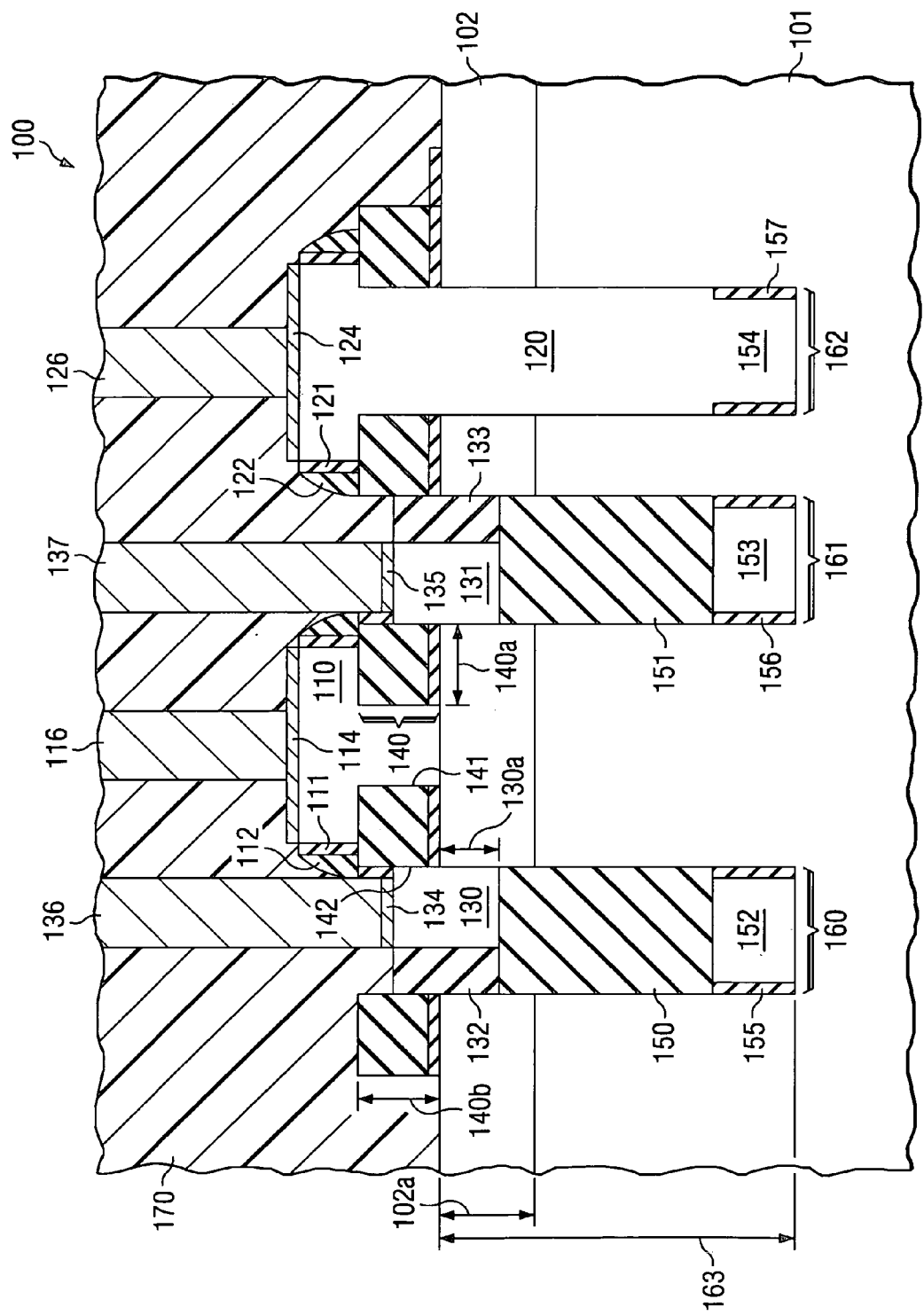
FIG. 1 is a schematic cross section of a portion of a semiconductor substrate depicting a heterojunction bipolar transistor device according to an embodiment of the invention.

FIG. 1 illustrates a schematic cross section of a portion of a semiconductor substrate 101 depicting a heterojunction bipolar transistor (HBT) device, generally designated 100, according to an embodiment of the present invention. The semiconductor substrate is monocrystalline and has a first conductivity type. Preferably, the substrate is made of silicon and the conductivity is n-type; the considerations of this invention, however, also apply to p-type semiconductor substrate material, and to any other semiconductor material, including gallium arsenide, used in device production.

In the example of FIG. 1, the surface of substrate 101 is topped by a monocrystalline surface layer 102. This surface layer 102 is epitaxially grown and may have intrinsic conductivity or opposite conductivity type; it may be composed of the same semiconductor material as substrate 101 or it may be a different semiconductor. As examples, surface layer 102 may be p-type silicon on an n-type substrate 101, or it may be intrinsic silicon germanium on an n-type silicon substrate 101. The thickness 102a of layer 102 is preferably between about 100 and 300 nm. In some embodiments, layer 102 may cover the whole substrate surface; in other embodiments, it may be a local layer in the region of the base-to-be-built.

Device 100 has an emitter contact comprising the region 110 made of polycrystalline semiconductor of the first conductivity type, and a collector contact comprising the region 120 of polycrystalline semiconductor of the first conductivity type. The actual junctions are not shown in FIG. 1. The base contact is indicated by two regions 130 and 131 of polycrystalline semiconductor of the opposite conductivity type; it is preferred that the base actually surrounds the emitter in order to reduce the transverse base-emitter resistance by several factors. A preferred configuration of the surrounding base is a ring-like shape (for instance, circular or rectangular); frequently, the emitter is in the center of the surrounding base. As FIG. 1 depicts, the base contact 130/131 extends through a substantial portion of surface layer 102; in the example shown, the portion is designated 130a. In order to define the extent of the transistor and confine the base contact to this extent, insulating regions 132 and 133 keep the base contacts separate from the remainder of the substrate; the separating regions are shown in FIG. 1 by insulating regions 132 and 133; they are preferably silicon dioxide.

FIG. 1 further illustrates that base contact 130/131 is spaced apart from the emitter contact 110 by a wall of first insulator 140, which has a width 140a. First insulator 140 is silicon carbide or a stack of a thin oxide layer topped by silicon carbide; the insulator thickness 140b is preferably in the range from 50 to 300 nm. In addition to serve as spacing elements between base and emitter, the blocks of the first insulator 140 act as walls, which define the geometries of the emitter contact, the collector contact, and the base structure and thus support the ongoing technology trend for scaling.

As FIG. 1 shows, the base and the collector structures are positioned in trenches 160, 161, and 162, respectively. The trenches are fabricated in the same process step (see below) and thus have identical depths; depth 163 is preferably between about 0.2 and 1.0 μm. In trenches 160 and 161 are localized buried second insulator regions 150 and 151 below the polycrystalline base regions 130 and 131, respectively. When the base contact 130/131 is configured as a ring-like structure, trenches 160/161 and the second insulator regions 150/151 have the same ring-like configuration. Second insulators 150/151 preferably comprise silicon dioxide or related oxides of the substrate semiconductor. These structural features render the base contacts of device 100 "on insulator"; they give device 100 immunity to cosmic radiation faults and provide low base-to-collector capacitance. The depth 163 of the trenches is selected to control the base resistance, both the parasitic and the transverse base collector capacitance, the collector length, and also to influence the collector resistance.

Selectively located under the insulator regions 150 and 151 are polycrystalline semiconductor regions 152 and 153, which are heavily concentrated with dopants of the first conductivity type and act as a "buried layer". Furthermore, a similar polycrystalline semiconductor region 154 is selectively located under the collector contact 120; this polycrystalline region is also heavily concentrated with dopants of the first conductivity type and acts as a "buried layer". All these regions 152, 153, and 154 are preferably made of polysilicon (the fact that they are surrounded by thin insulator layers 155, 156, and 157, respectively, is only a consequence of the manufacturing process, see below). Since these heavily doped buried polysilicon regions substitute for a buried layer, but are easier to fabricate than a conventional buried layer, they represents an overall fabrication simplification.

Since trenches 160, 161, and 162 are created in a single process step in conjunction with walls 140, the components within each trench are substantially aligned. As an example, in trench 160, the following features are aligned in a substantially straight line: the boundary of polysilicon base contact 130 facing insulator 140; the boundary of polysilicon base 130 and semiconductor layer 102 (as the transistor's base region), the boundary of insulator 150 and semiconductor layer 102; the boundary of insulator 150 and substrate 101; and the boundary of polysilicon region 152 and substrate 101. In other words, the components inside a trench all appear "self-aligned" and thus save photomask and mask alignment steps.

FIG. 1 further illustrates another embodiment of the invention. The surface layer 102 has a conductivity type opposite to the first conductivity type of the substrate 101 and a certain sheet resistance based on its doping level. The first insulator 140 on the layer surface has a width 140a, a first side 141 and a second side 142. The emitter contact 110 (polycrystalline semiconductor such as polysilicon, doped in first conductivity type) is adjoining the first insulator side 141. The base contact 130/131 (polycrystalline semiconductor such as polysilicon, doped in opposite conductivity type) is spaced from the emitter contact 110 by the insulator width 140a so that the product of this width and the sheet resistance of layer 102 determines the transistor base resistance. The collector contact 120 is positioned in substrate 101 so (especially by its buried doped polycrystalline region 154) that it converts the substrate into an extended collector region.

As FIG. 1 indicates, emitter contact 110 has sidewalls preferably of liner oxide 111 and liner nitride 112, and collector contact 120 has sidewalls preferably of liner oxide 121 and liner nitride 122.

In order to provide contacts to emitter 110, base 130/131, and collector 120, FIG. 1 indicates metal-semiconductor layers 114, 134/135, and 124, respectively, (preferably metal silicides), and contact metals 116, 136/137, and 126, respectively. The metal contacts are embedded in the interlevel insulator 170.

The embodiment of FIG. 1 can be manufactured by a low-cost HBT process flow, which operates with two photomasks less compared to standard HBT process (six photomask steps compared to eight), while it maintains features such as self-aligned emitter/base structures. The innovative process flow includes well-controllable process techniques such as deposition of silicon carbide, chemical-mechanical polishing, trench etching, and anisotropic etching. According to the invention, the method for fabricating a bipolar or a heterojunction bipolar transistor in a monocrystalline semiconductor substrate of a first conductivity type and including a surface layer of the opposite conductivity type, comprises the steps of forming an emitter contact on the surface layer; forming a base contact extending through a substantial portion of the surface layer, spaced apart from the emitter; forming an insulating region buried under the base contact and aligned with the base contact; forming a collector contact; forming a polycrystalline semiconductor, first-conductivity doped region selectively located under the insulating region and aligned with the insulating region; and forming a polycrystalline semiconductor, first-conductivity doped region selectively located under the collector contact and aligned with the collector contact.

Another embodiment of the invention is a method for fabricating a bipolar transistor, or a heterojunction bipolar transistor, in a semiconductor substrate having a first conductivity type, including a surface layer of the opposite conductivity type. The method comprises the steps of forming an insulator body on the surface layer, wherein this body has a width and first and second sides; forming an emitter structure having a contact on the surface layer, this contact adjoining the first insulator side; forming a base structure having a contact extending through a substantial portion of the surface layer at the second insulator side, this base contact spaced from the emitter contact by the insulator width; and forming a collector contact in the substrate so that it converts the substrate into an extended collector region.

In more detail, the method for fabricating a bipolar, or a heterojunction bipolar, transistor in a monocrystalline semiconductor substrate of a first conductivity type is described by the process steps of FIGS. 2 to 16.

Figure 2:
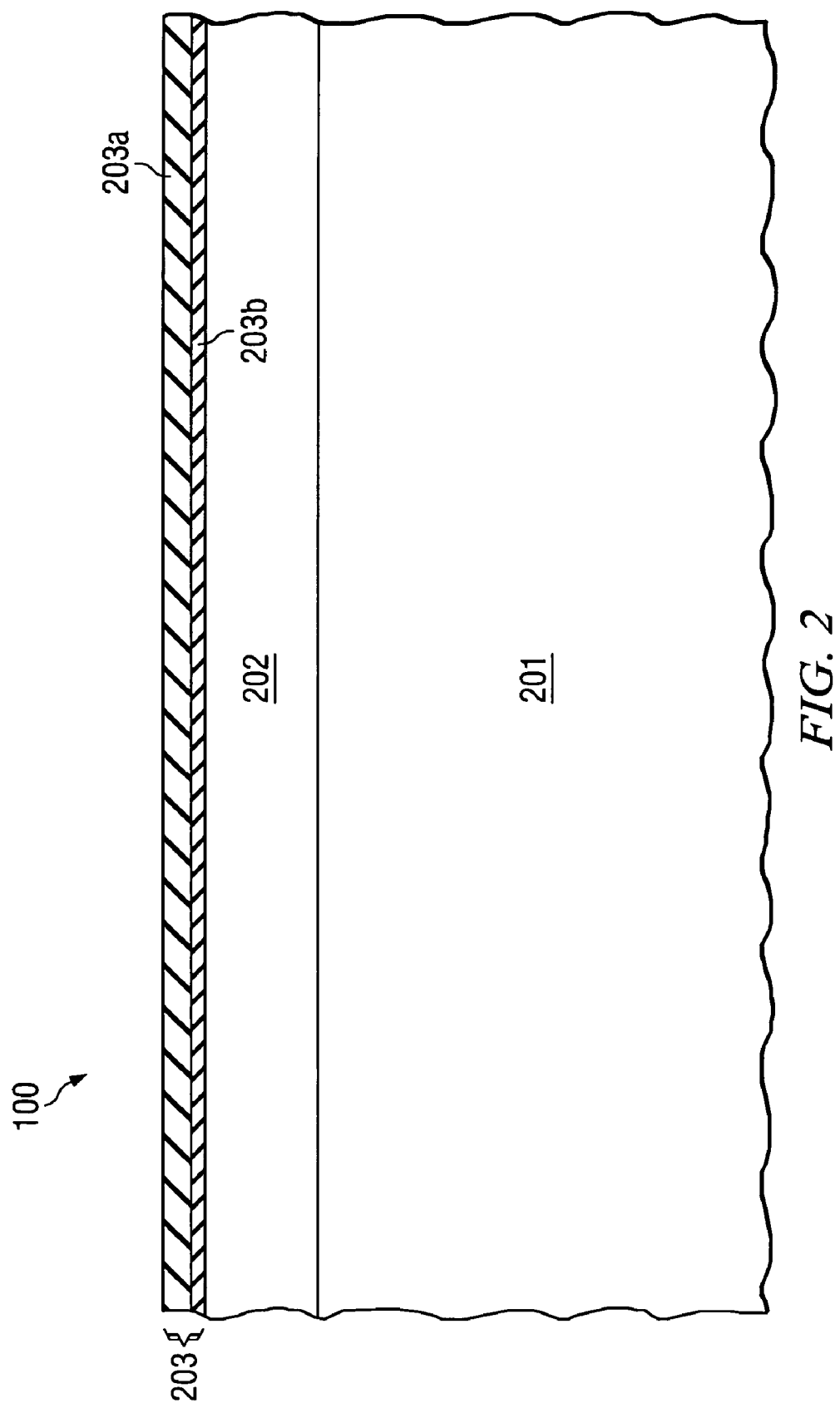
FIGS. 2 to 16 are schematic cross sections of a portion of a semiconductor substrate illustrating another embodiment of the invention, the process steps of a method for fabricating a heterojunction bipolar transistor.

In the schematic cross section of FIG. 2, the process starts by growing epitaxially on monocrystalline semiconductor substrate 201 a layer 202 of a semiconductor in a thickness suitable to form the base region of the transistor. Preferably, substrate 201 is silicon; it may, however, be gallium arsenide or any other semiconductor used for device fabrication. Layer semiconductor 202 is either the same element as the substrate, for instance, silicon, or a different semiconductor, for instance, silicon germanium. Layer semiconductor 202 is either intrinsic or of the opposite conductivity type than substrate 201. Preferably, layer 202 is between 100 and 300 nm thick. In other embodiments, layer 202 is not created epitaxially, but by an ion implantation and diffusion step.

Next in FIG. 2, a layer 203 of a first insulator is deposited; this first insulator has silicon carbide 203a on its surface in a thickness range from about 200 to 300 nm. This silicon carbide is suitable to provide a barrier to chemical-mechanical polishing processes. Layer 203b is a deposited oxide, for instance silicon dioxide, useful to protect the underlying semiconductor during the silicon carbide deposition process. The thickness of the layer stack oxide/silicon carbide is preferably between 200 and 300 nm.

After the silicon carbide layer deposition, a first layer of oxide is deposited. Preferably, this first oxide layer is between 200 and 350 nm thick. A photomask is placed over the oxide, which protects the areas destined to become the transistor emitter, base, and collector regions. The oxide portions between these protected areas are etched open so that the underlying silicon carbide is exposed. These openings mark the locations for the intended walls around the intended emitter, base, and collector structures. Silicon carbide material is then deposited into these openings, and any excess carbide is etched back to the level of the first oxide layer.

Figure 3:
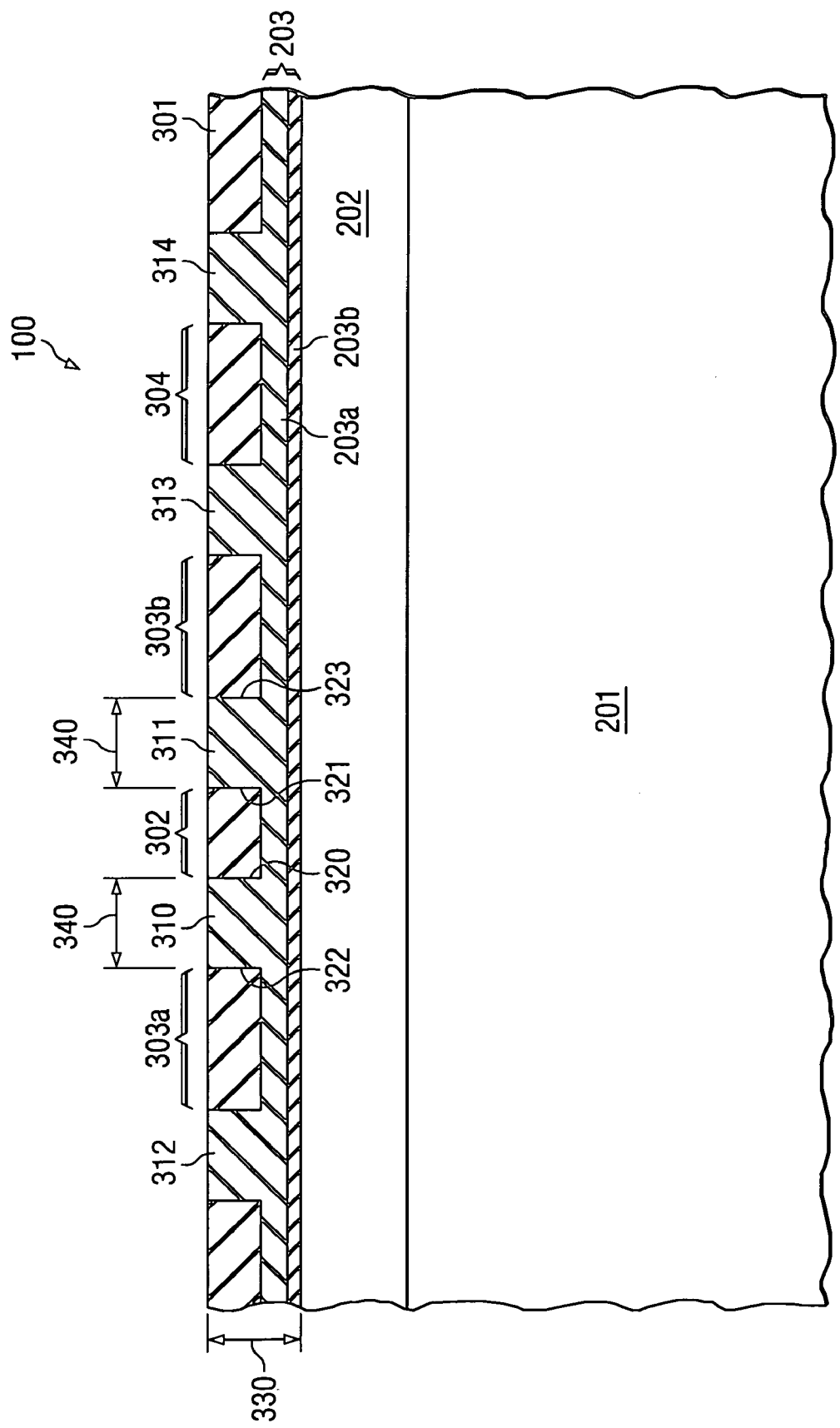

FIG. 3 illustrates this stage of the process flow. The first oxide layer is designated 301, the extent of the intended emitter 302, the extent of the intended base (designed to surround the emitter) 303a and 303b, and the extent of the intended collector 304. The walls of silicon carbide marking the lateral extensions of the emitter are designated 310 and 311, of the base are designated 312 and 310, and 311 and 313, and of the collector are designated 313 and 314. The first sides of the silicon carbide walls facing the intended emitter 302 are marked 320 and 321, respectively, and the second sides of the silicon carbide walls facing the intended base 303a and 303b are marked 322 and 323, respectively. The width of the silicon carbide walls is designated 340, and the height 330 (wall plus first insulator layer 203).

After the deposition of the silicon carbide walls, the remaining oxide between the walls is removed by etching. In the next process steps illustrated by FIG. 4, a photomask 401 is placed over silicon carbide walls and first isolator layer so that the locations for the intended base and collector structures remain exposed. Protected by the photomask are the areas of the walls 310, 311, 312, 313, and 314, and the first insulator layer 203a/203b between walls 310 and 311; this stretch of the first insulator layer determines the area of the intended emitter.

Figure 4:
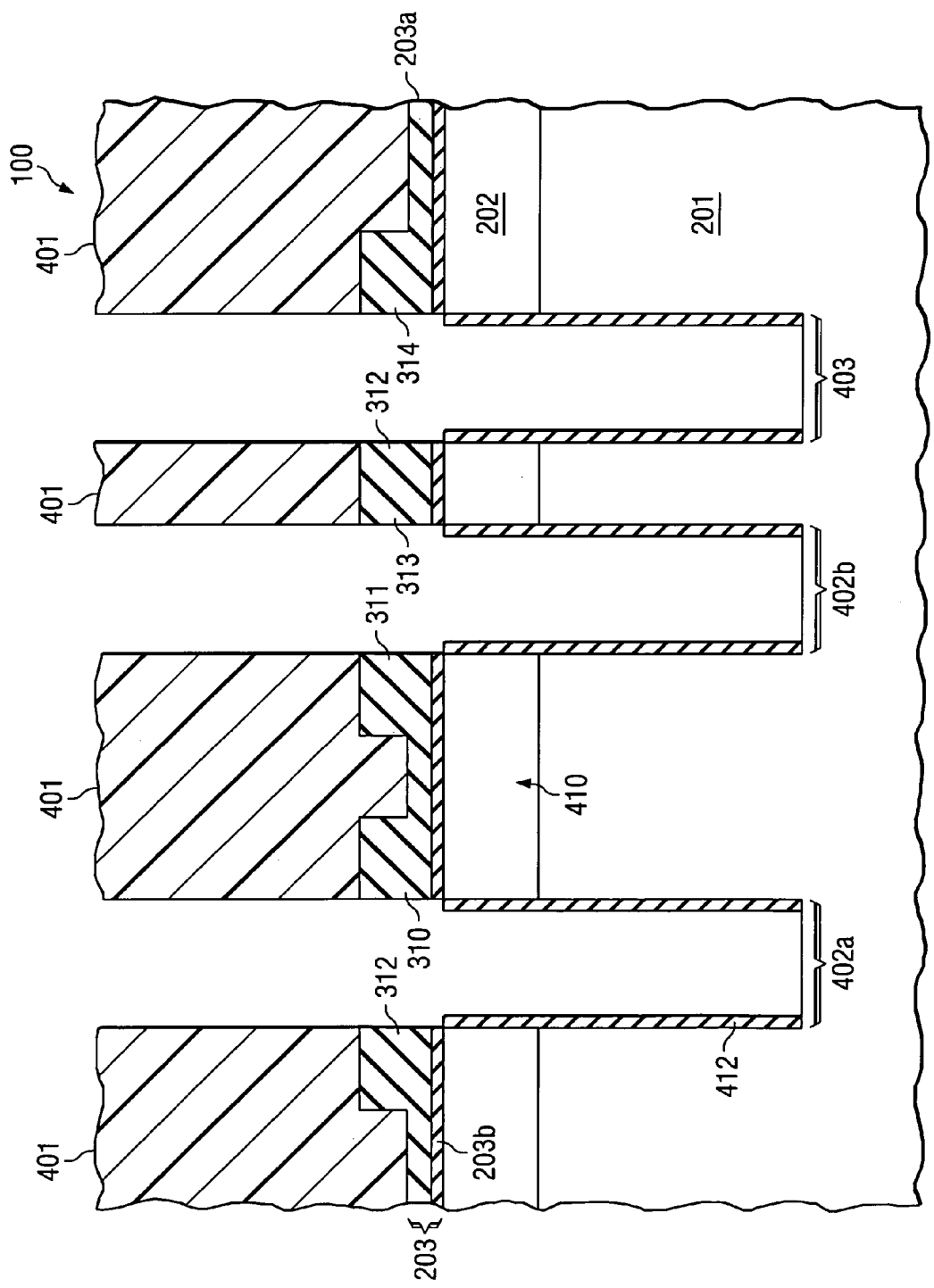

Trenches are then formed by anisotropically etching sequentially through the exposed first isolation layer 203a/203b, the semiconductor layer 202, and the underlying semiconductor substrate 201. The trenches are preferably between about 0.2 and 1.0 µm deep. The preferred anisotropic etch technique comprises reactive ion etching. In FIG. 4, the trenches for the base structure are designated 402a and 402b, since in this example the base is conceived as a structure surrounding the emitter. The base trenches surround the intended monocrystalline base region of width 410. The trench for the collector structure is designated 403. In the last process step of FIG. 4, oxide layers 410 are grown as liners in the trenches and anisotropically etched away from the bottoms of the trenches.

Figure 5:
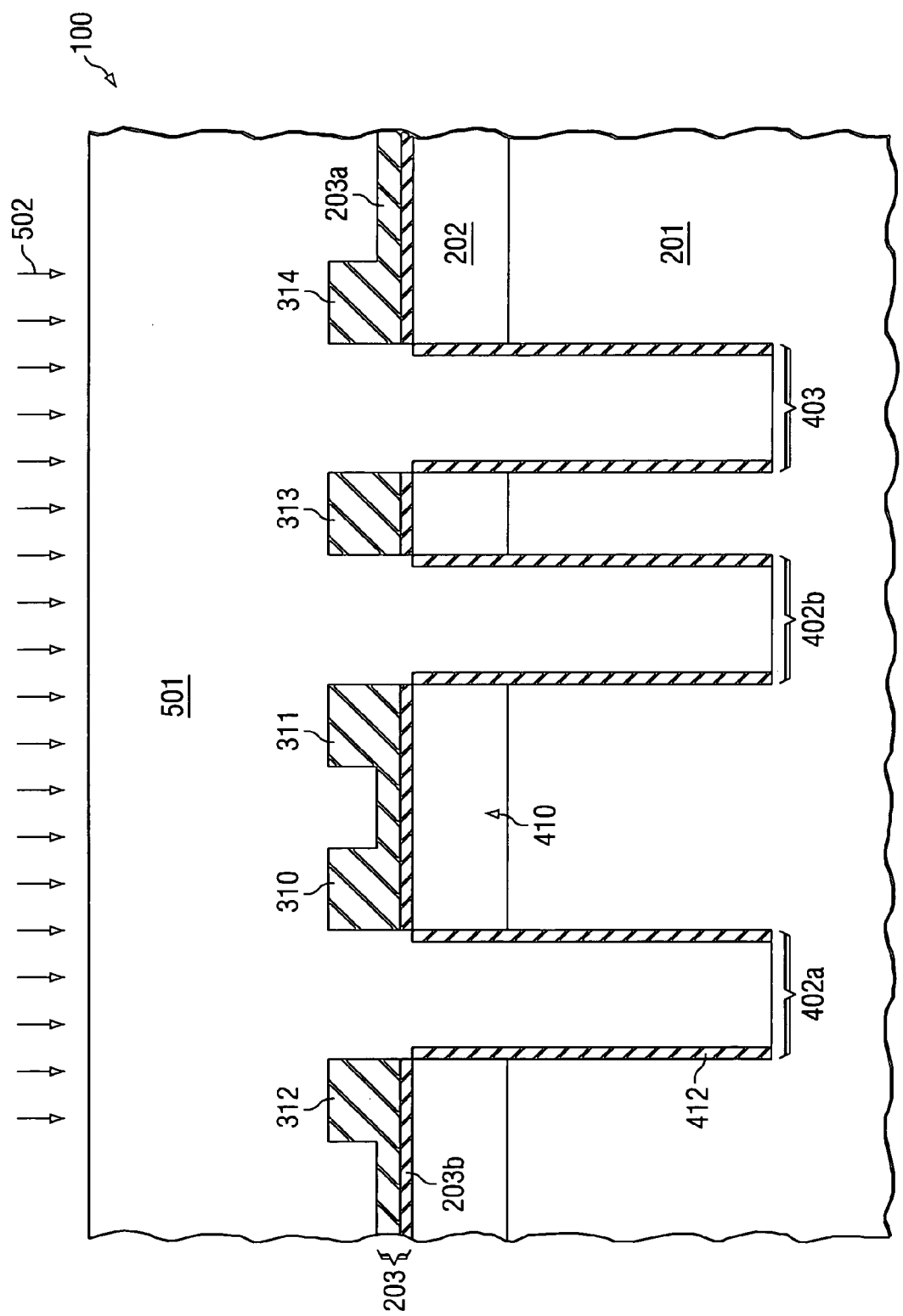

In the process step displayed in FIG. 5, first polycrystalline semiconductor material 501 is deposited to fill the trenches and form a continuous layer on top of the remaining silicon carbide. Preferably, this first polycrystalline semiconductor material is polysilicon. Next, dopants 502 of the first conductivity type are implanted, at 90° to the surface and at high energy and dose, to the bottom of the polycrystalline trenches. When the first conductivity type is n-type, the dose is preferably between about 1e14 and 1e15/cm$^2$ and the energy about 50 to 100 keV for phosphorus and about 100 to 200 keV for arsenic. From the bottom of the trenches, the implanted dopants are diffused into the mono-crystalline semiconductor 201 for selective high doping.

Figure 6:
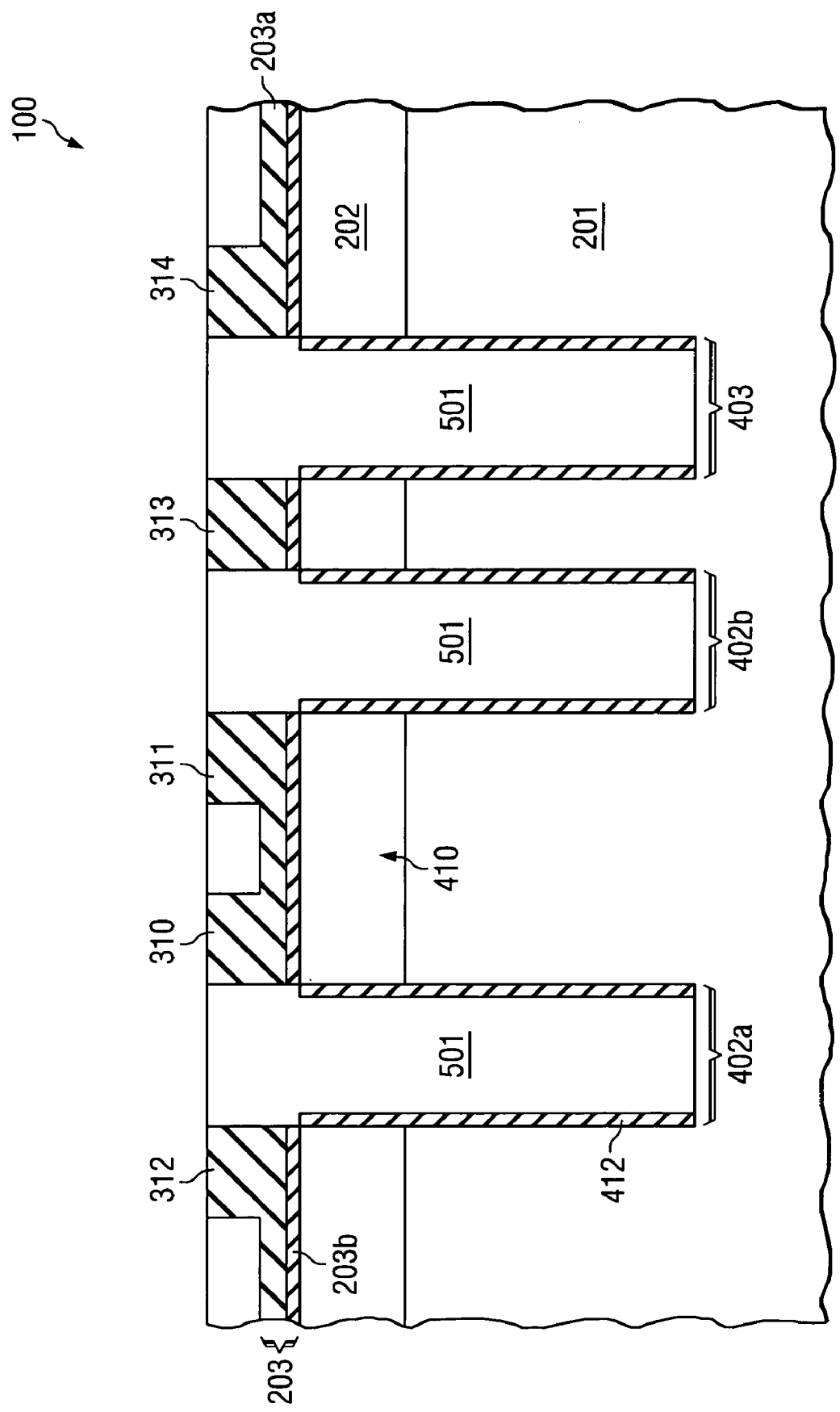

As seen in FIG. 6, the next process step involves chemical-mechanical polishing of the continuous layer portion of polycrystalline semiconductor 501, until the underlying silicon carbide walls 310, 311, 312, 313, and 314 are exposed. In the trenches, the polycrystalline semiconductor material 501 remains.

Figure 7:
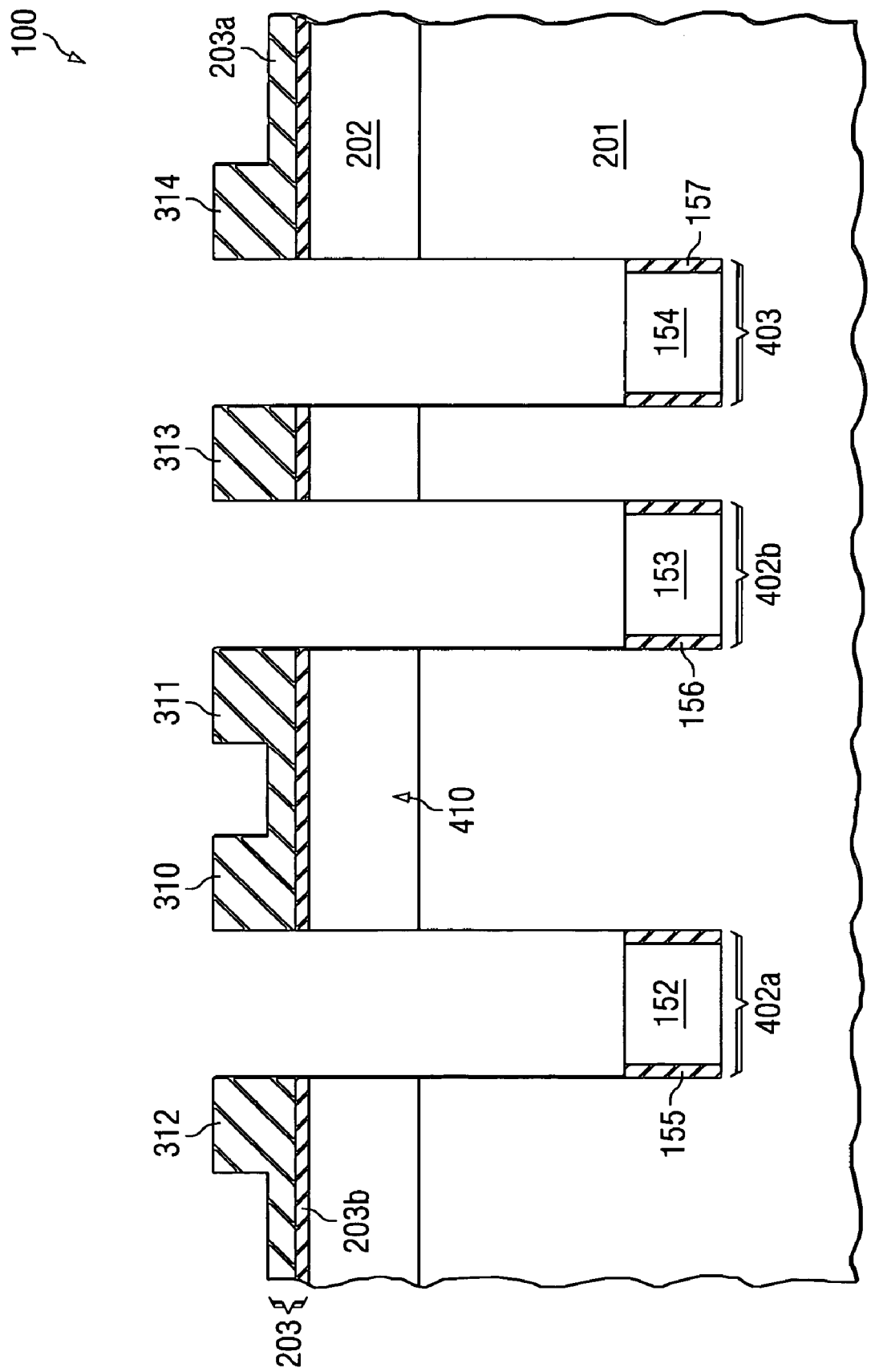
Figure 8:
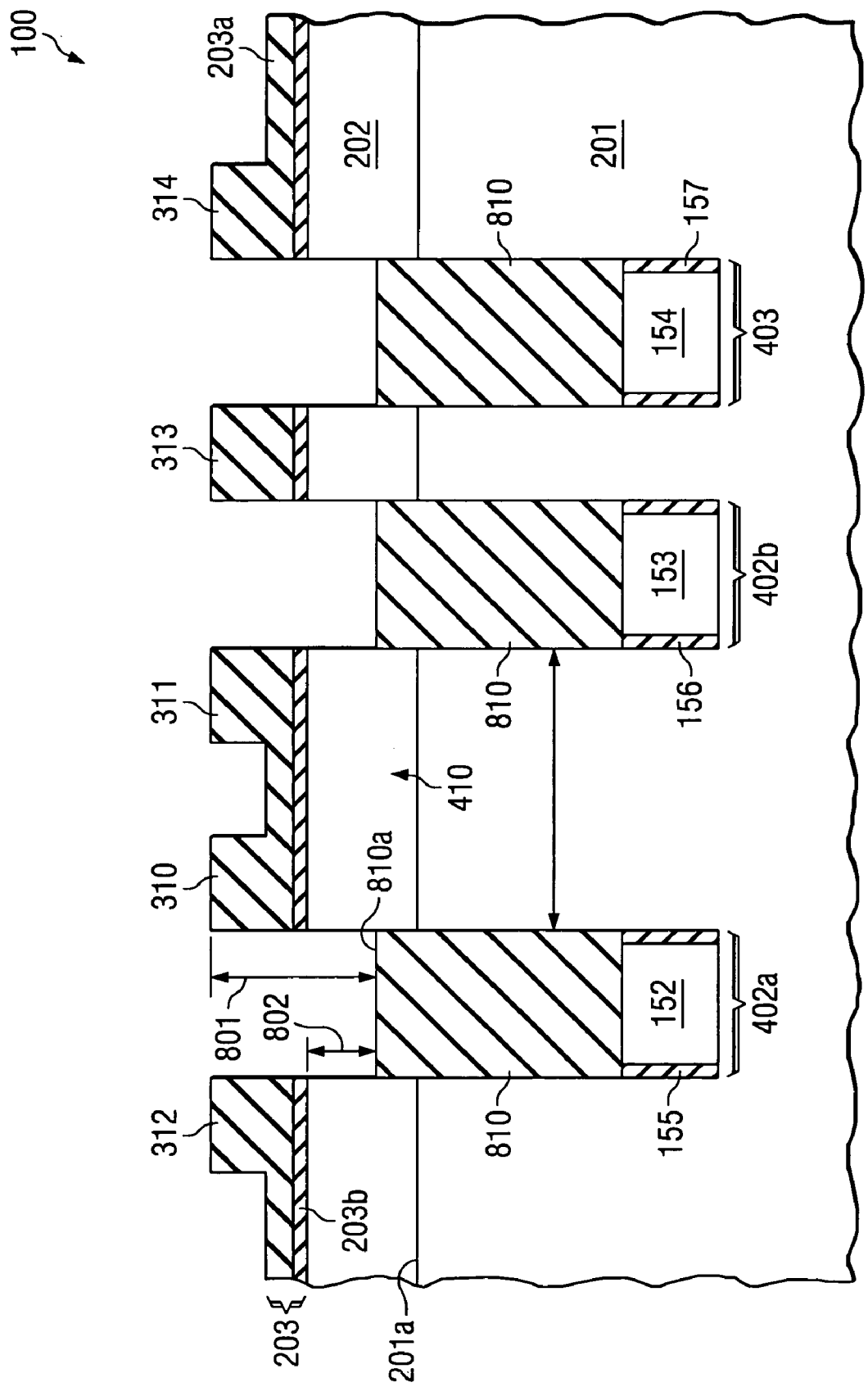

In the next process step, shown in FIG. 7, this polycrystalline semiconductor material 501 in the trenches is etched anisotropically so that a predetermined thickness, preferably between about 100 and 300 nm, is left in the trenches. These remaining, heavily doped polycrystalline semiconductor regions are designated in FIG. 7 by the same numbers 152, 153, and 154, as in FIG. 1. The regions are in selective places at the bottom of the trenches and substitute for the conventional buried layer.

A second insulating material 810 is then deposited in order to fill the trenches and form a continuous layer on top of the remaining silicon carbide. A preferred choice for this second insulating material is silicon dioxide or a composite insulating material including silicon dioxide. Chemical-mechanical polishing is then applied to the continuous layer of the second insulating material until the underlying silicon carbide layer is reached. As FIG. 8 indicates, a timed anisotropical etch removes the remaining second insulating material in the trenches 402a, 402b and 403 to a depth 801, which exposes a monocrystalline semiconductor side-length 802 sufficient for reliable contacts-to-be-formed to the monocrystalline base region 410. The exposed monocrystalline semiconductor side-length is preferably between about 100 and 300 nm long. The newly created surface 810a of the remaining second insulating material 810 may coincide with the original surface 201a of the monocrystalline substrate, or it may lay higher, as exemplified in FIG. 8.

Figure 9:
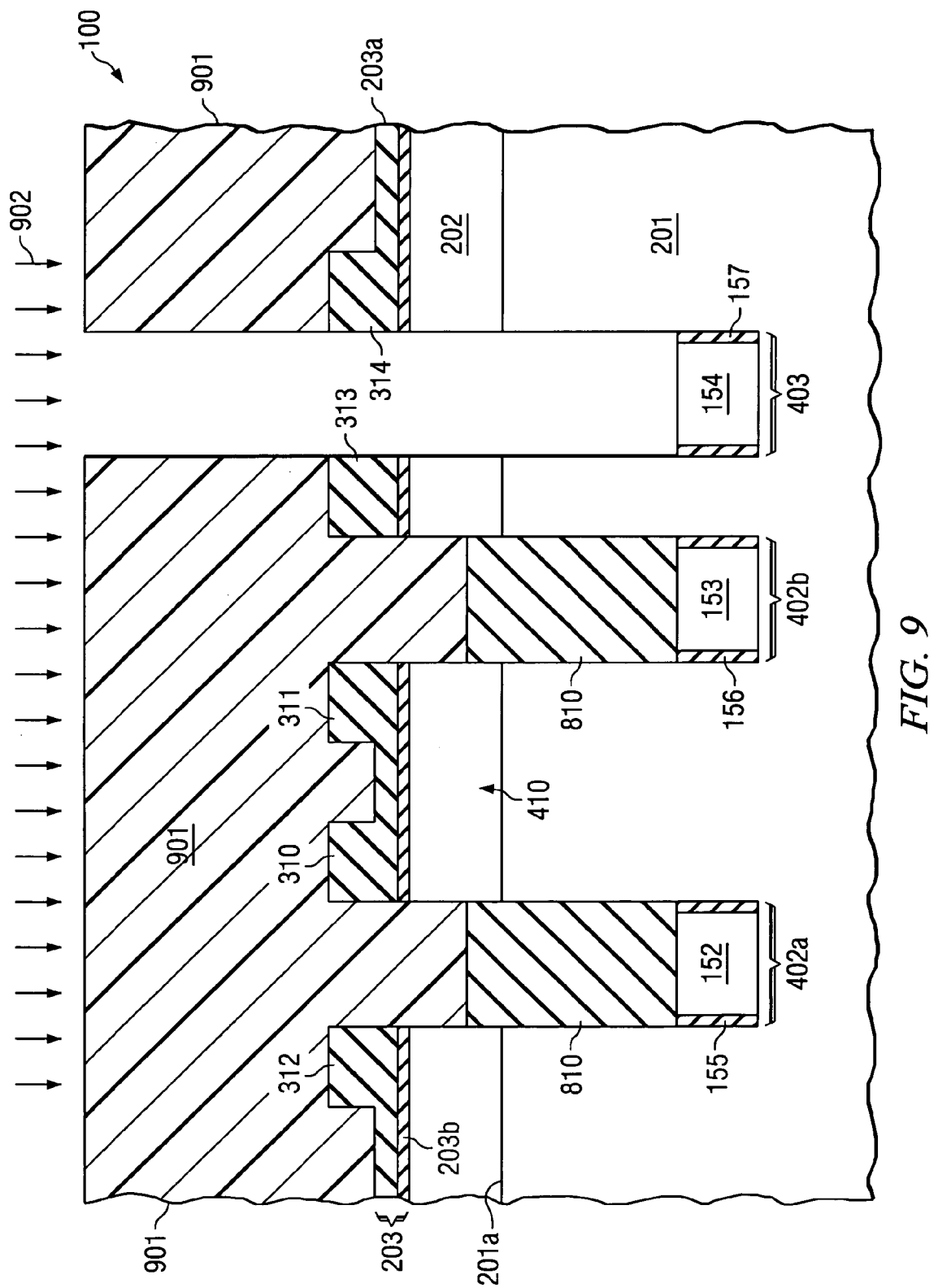
Figure 10:
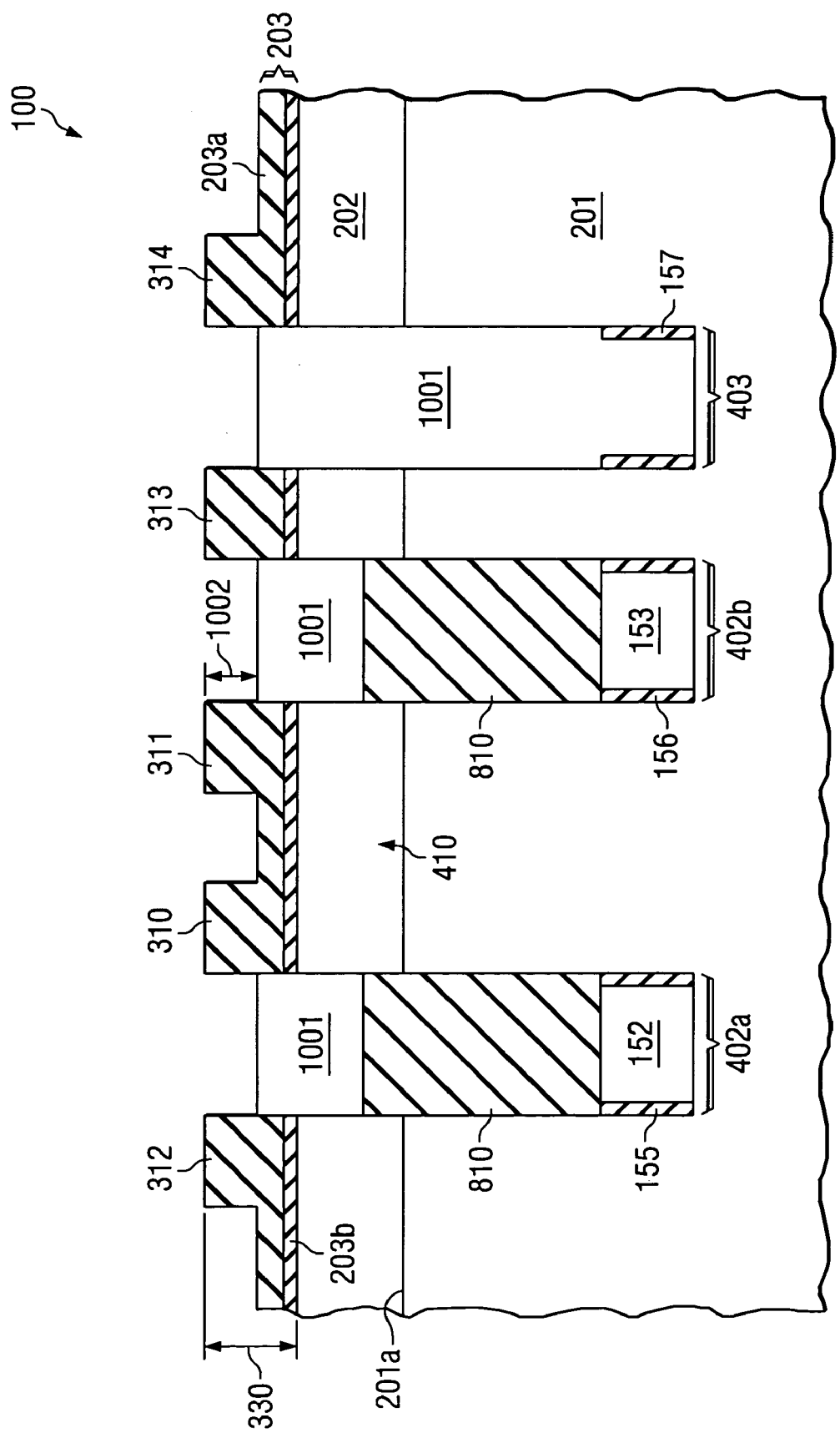

FIG. 9 illustrates the next photomask 901, which protects the transistor area except for the trench 403 intended to be the collector contact. The second insulating material 810 in the now exposed trench 403 is removed by etching. Dopants 902 of the first conductivity type are implanted, at 90° to the surface and at low energy and high dose. After removing the photomask, the dopants are diffused into substrate 201 to create a collector quasi-buried layer connection 154. The collector implant creates a collector doping concentration of about 1e19 to 1e20/cm$^3$.

The next process step deposits a second polycrystalline semiconductor material 1001 to fill the trenches 402a, 402b, and 403, and form a continuous layer on the silicon carbide layer and walls. Preferably, the second polycrystalline semiconductor material is polysilicon. Chemical-mechanical polishing is then applied to the continuous polycrystalline semiconductor layer until the underlying silicon carbide is exposed. The second polycrystalline semiconductor material 1001 in the trenches is further anisotropically etched in a time-controlled manner to a depth 1002 less than the thickness 330 of the silicon carbide walls (plus first insulator layer) to leave the polycrystalline material needed for said intended base (in trenches 402a and 402b).

Figure 11:
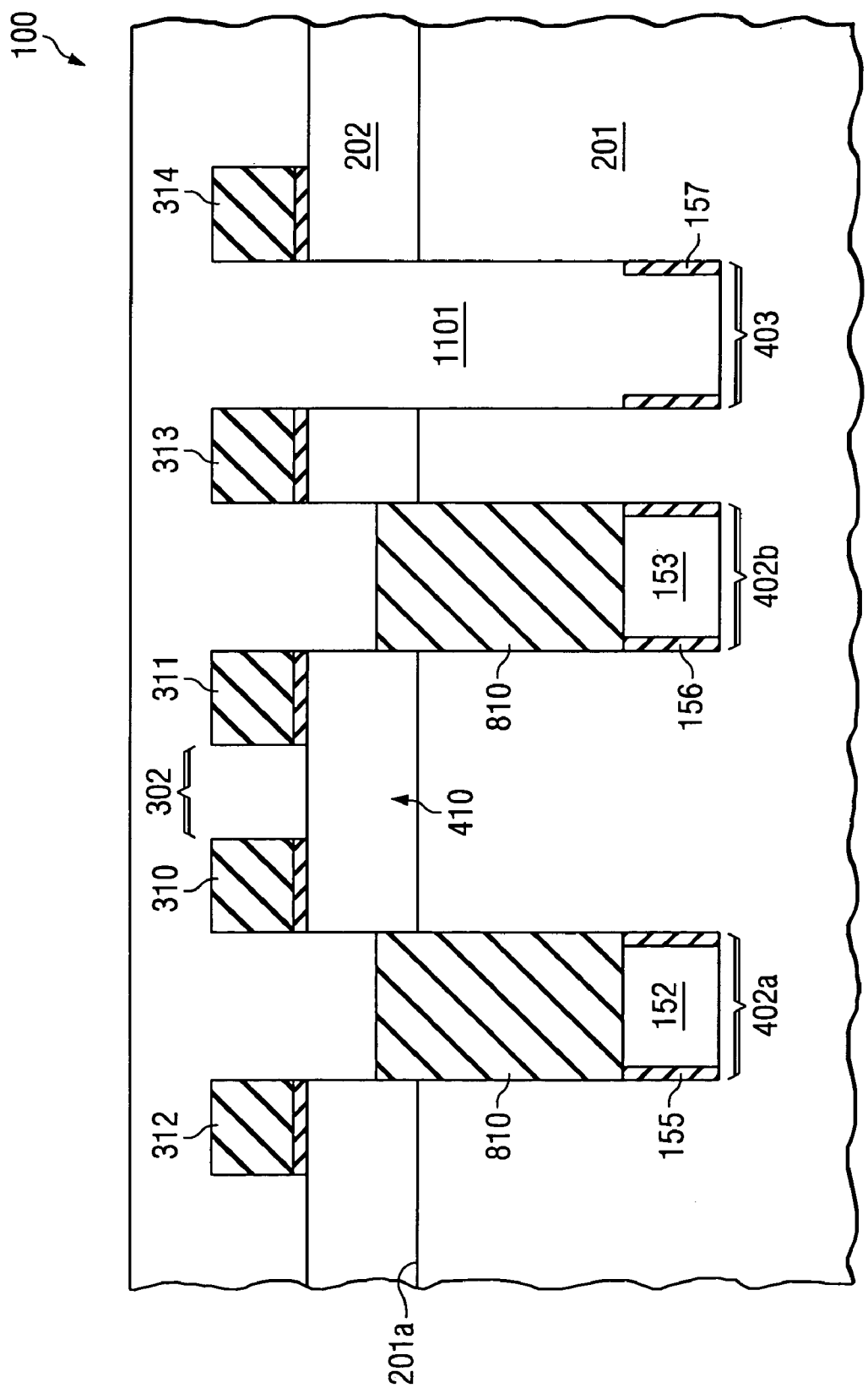

In FIG. 11, the remaining portions of the first insulator layer 203 are etched; this deepens the opening 302 for the intended emitter to the surface of the semiconductor layer 202. Next, a third polycrystalline semiconductor material 1101 is deposited in the trenches 402a, 402b, and 403, and in the deepened emitter opening 302, including a continuous layer on the silicon carbide walls. The preferred material for the third polycrystalline semiconductor is polysilicon.

Figure 12:
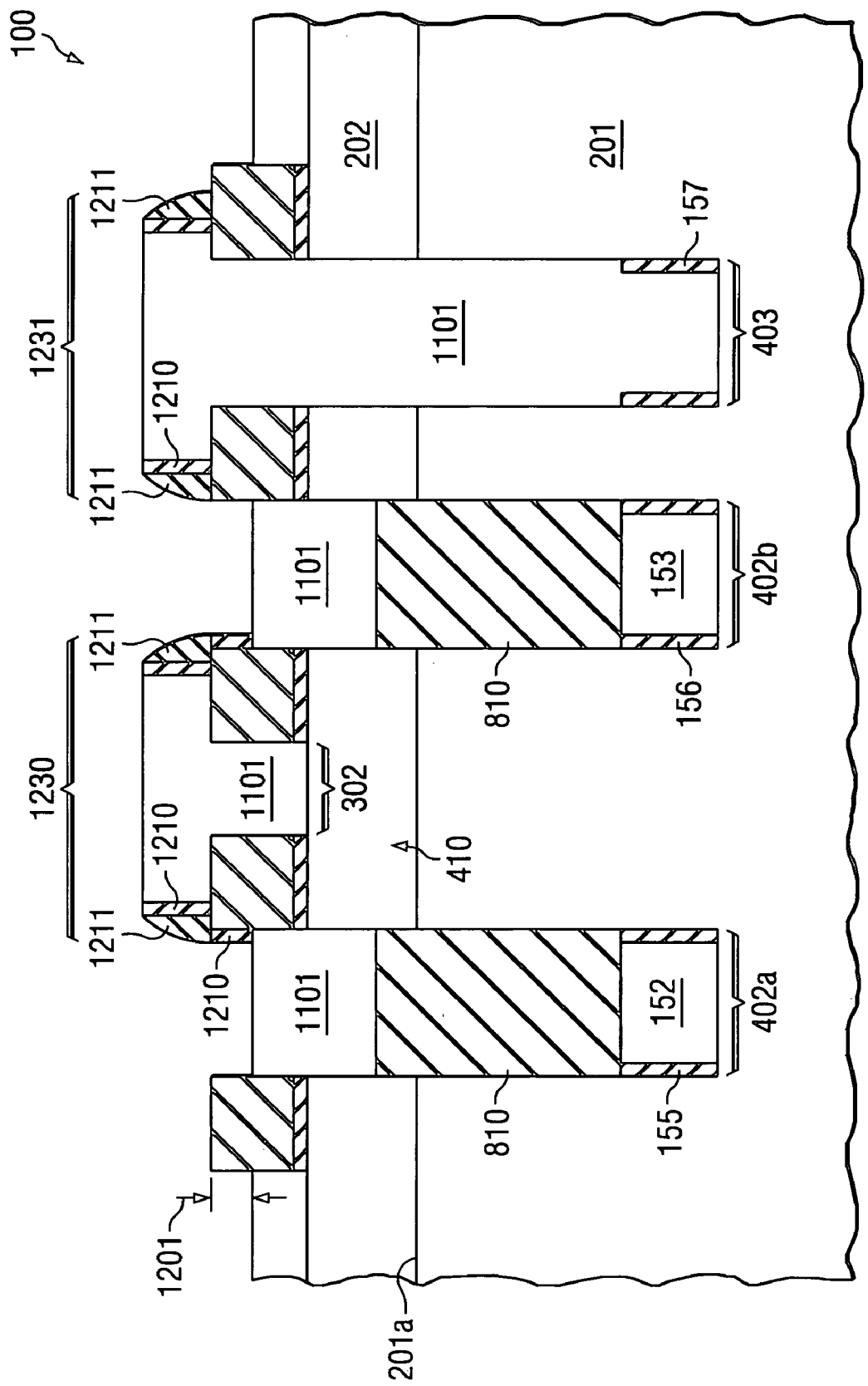

The next process step involves the trenches 402a and 402b; trench 403 and the intended emitter area 302, together with the adjacent silicon carbide walls, remain protected by a special photomask. The step comprises etching the third polycrystalline semiconductor 1101 in a time-controlled manner to remove the continuous layer together with material in trenches 402a and 402b to a depth of approximately half the first insulator layer thickness 330, or, as a practical matter, approximately half the silicon carbide wall thickness. In FIG. 12, the etched depth is designated 1201.

As illustrated in FIG. 12, the regions of third polycrystalline semiconductor 1101 in the intended emitter structure 302 and the intended collector structure 403 obtain depositions of liner oxide 1210 and liner nitride 1211 in the methodology widely practiced in known technology. This methodology involves etching the deposited nitride and oxide layers so that sidewalls are formed around the intended emitter and collector polycrystalline contacts. In FIG. 12, the sidewall-enclosed third polycrystalline material of the intended emitter ("emitter-poly") is given the designation 1230, and the sidewall-enclosed third polycrystalline material of the intended collector ("collector-poly") the designation 1231.

Figure 13:
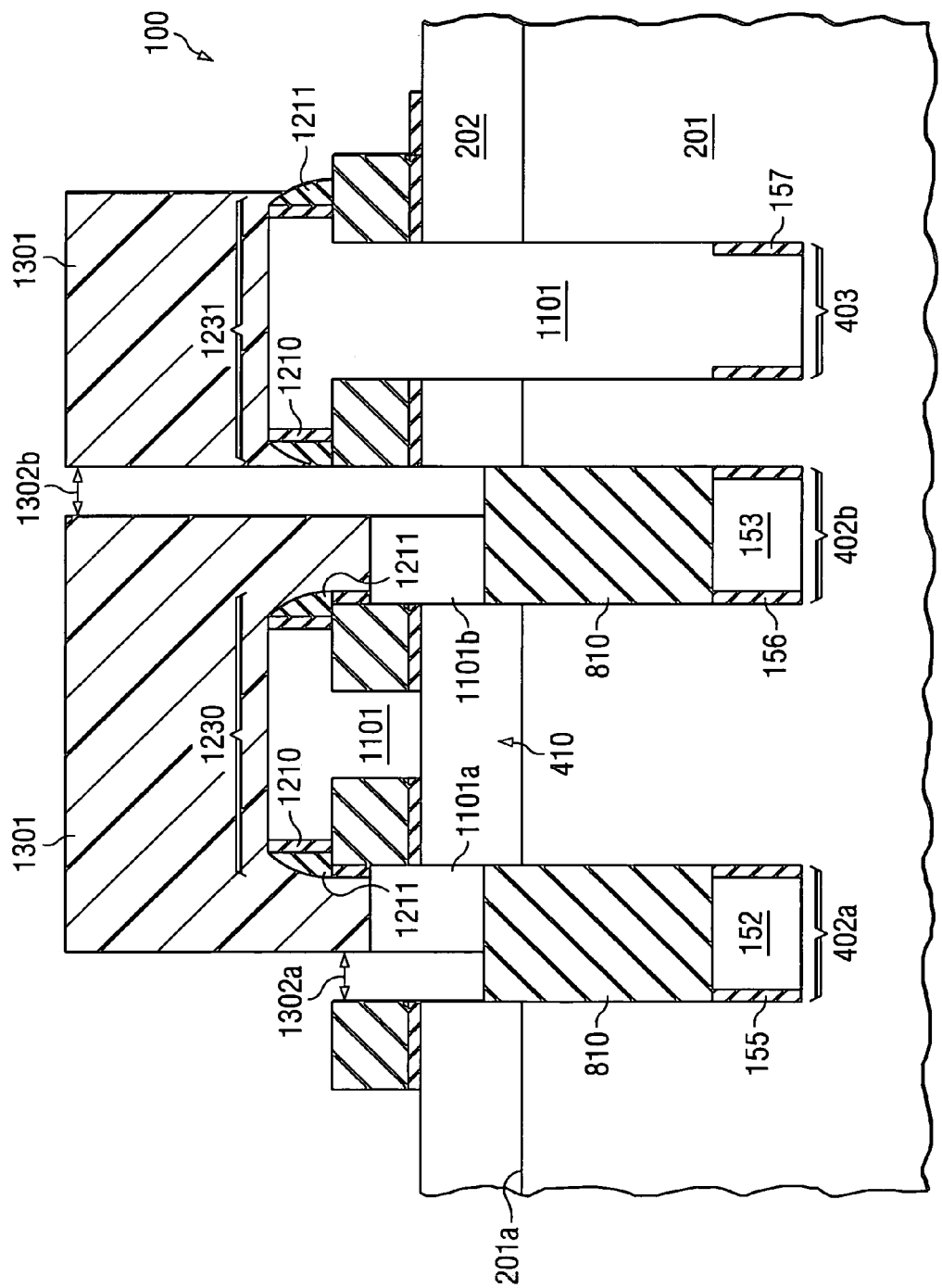

In FIG. 13, a photomask 1301 protects emitter-poly 1230 and collector-poly 1231, and furthermore those portions 1101a and 1101b of the base third polycrystalline semiconductor ("base-poly") 1101, which are adjacent to the intended monocrystalline base region 410. The exposed portions of the poly-base are then etched to isolate the intended base contacts 1101a and 1101b from the collector monocrystalline semiconductor 201/202. The opened gaps are designated 1302a and 1302b in FIG. 13. Photomask 1301 is then removed.

Figure 14:
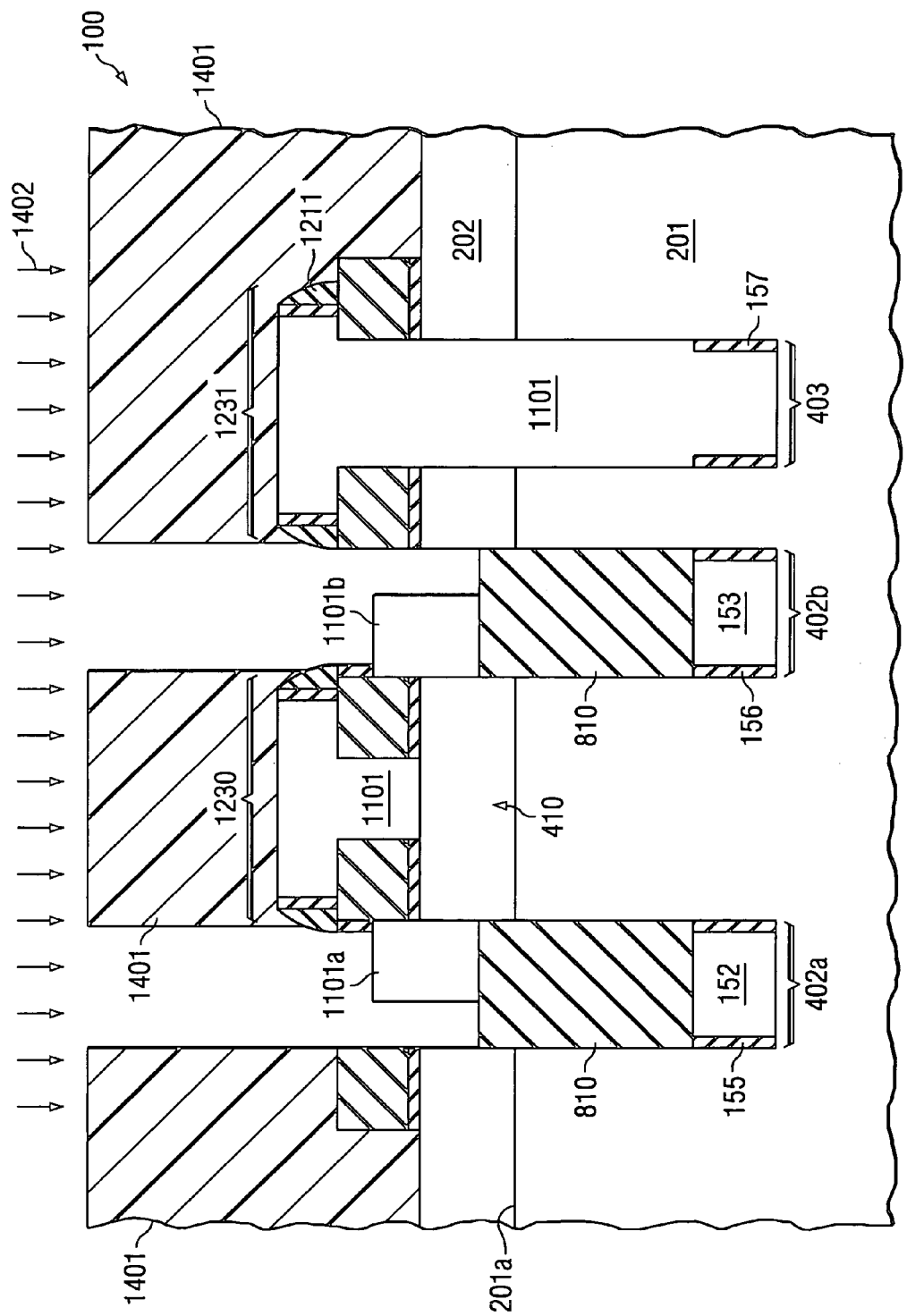

In FIG. 14, a photomask 1401 leaves the base-poly contact areas 101a/1101b exposed and masks the emitter and collector contact areas 1230 and 1231. Dopants 1402 of the opposite conductivity type are implanted, at low energy and high dose, into poly-base 1101a/1101b to create the base contact. Thereafter, photomask 1401 is removed. Preferred implant parameters for boron implant are about 40 keV energy and about 1e13/cm² dose.

Figure 15:
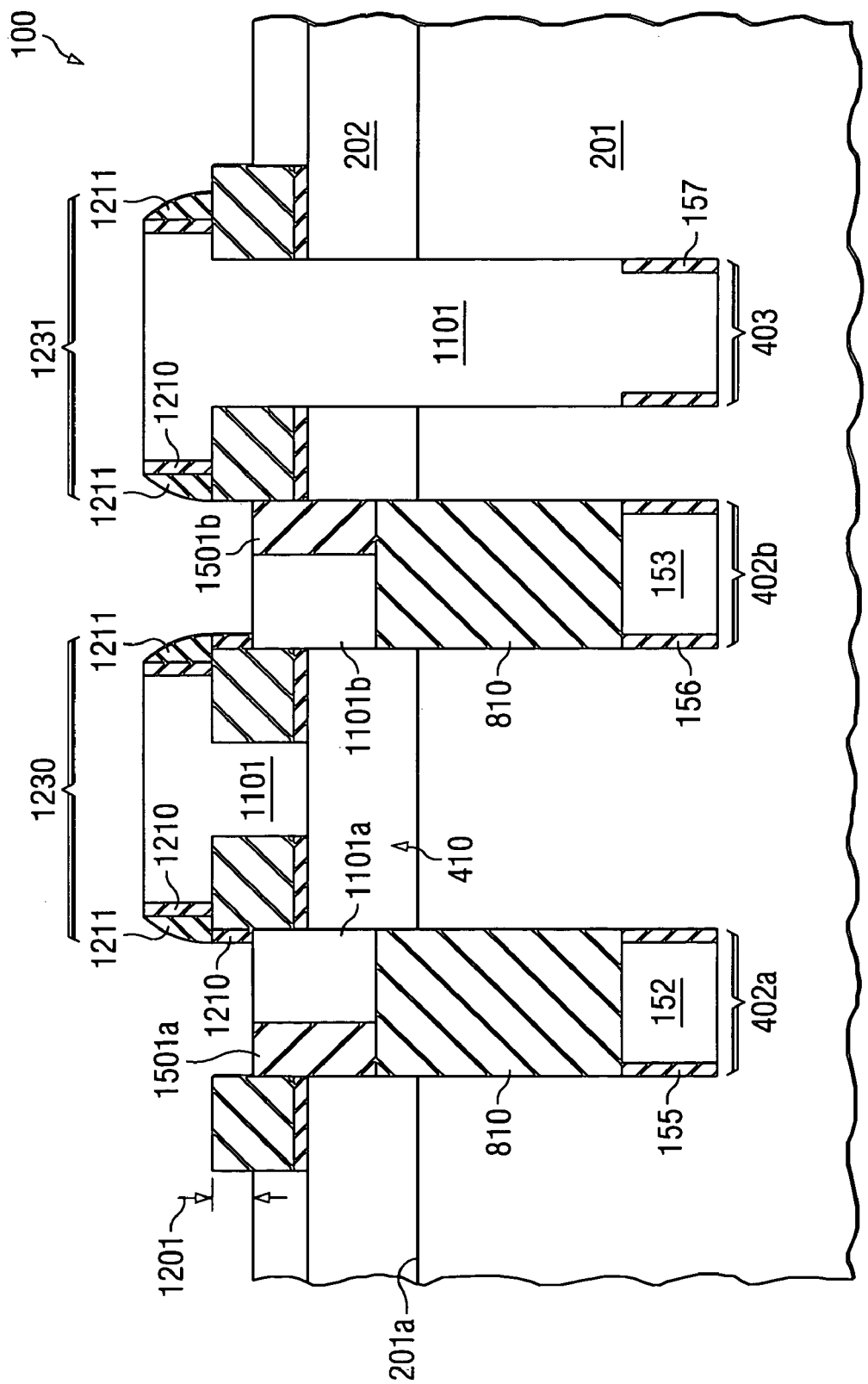

FIG. 15 depicts the process step of filling the gaps 1302*a* and 1302*b* between the base-poly contact and the monocrystalline semiconductor (collector) with a third insulating material, preferably including silicon dioxide. In FIG. 15, the fillers are designated 1501*a* and 1501*b*, respectively. The process of filling involves the deposition of the oxide and subsequent etch-back of any surplus deposited insulator. This process step is optional in the sense that gaps 1302*a* and 1302*b* may alternatively get filled in a later process step during the device encapsulation process.

Figure 16:
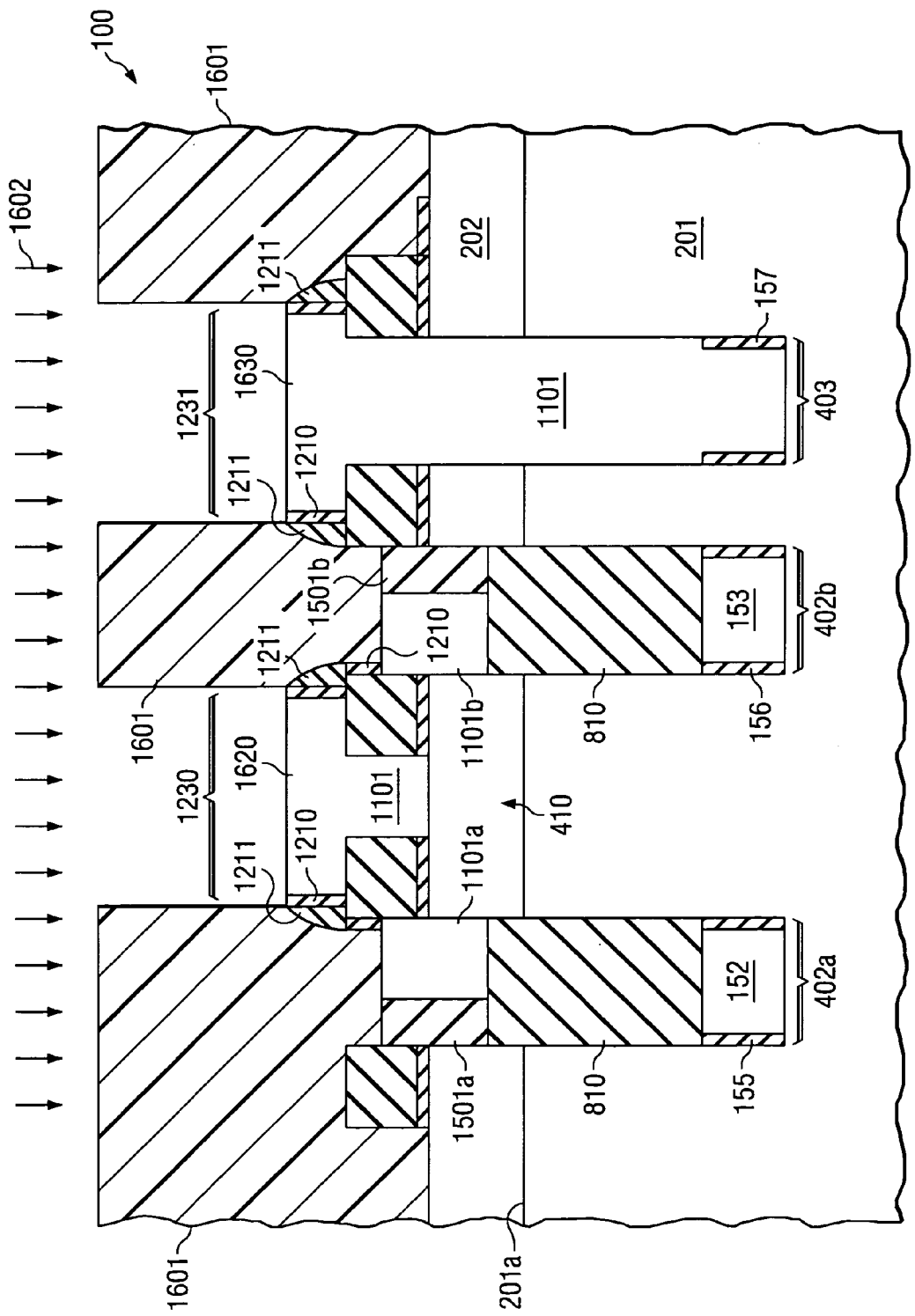

In FIG. 16, a photomask 1601 leaves the emitter contact area 1230 and collector contact area 1231 exposed and masks the base contact areas 1101*a* and 1101*b*. Dopants 1602 of the first conductivity type are implanted, at low energy and high dose, into poly-emitter 1620 and poly-collector 1630 to create the emitter and collector contacts, respectively. For arsenic, preferred implant conditions include about 50 keV energy and 1e13 to 1e14/cm² dose. Thereafter, photomask 1601 is removed.

The final process steps comprise the step of forming metal-semiconductor layers to the polycrystalline semiconductor contacts 1620 of the emitter, 1630 of the collector, and 1101*a* and 1101*b* of the base, and the step of forming metal contacts to the respective metal-semiconductor layers. An illustrations of the finished bipolar, or heterojunction bipolar, transistor has been described above in FIG. 1, using designations different from the ones employed for the steps of the process flow in FIGS. 2 to 16. FIG. 1 further includes schematically interlevel insulator/oxide or encapsulation material 170 embedding the surface of the transistor and the metal contacts.

In another embodiment of the invention, the monocrystalline surface layer of the opposite conductivity is replaced by a self-aligned implant of dopants having the opposite conductivity into the collector semiconductor substrate through the emitter opening 302 (see FIG. 11). In order to create this p-region, preferred implant conductions include a boron dose of about 1e11 to 1e12/cm² and an energy of 100 to 300 keV.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the material of the bipolar/heterojunction bipolar transistor may comprise silicon, silicon germanium, gallium arsenide, or any other semiconductor or compound material used in IC manufacturing. As another example, the conductivity of the starting semiconductor material may be n-type, or it may be p-type. As other examples, a variety of etching procedures can be used for the material removal steps discussed in the bipolar/heterojunction bipolar fabrication process flow. As another example, the transistor base may be configured in a number of different ways relative to the emitter: It may be a single contact; or it may partially surround the emitter; or it may completely surround the emitter; or it may have a variety of geometrical configurations and distances.

It is therefore intended that the appended claims encompass any such modifications or embodiments.

I claim:

1. A bipolar transistor in a monocrystalline semiconductor substrate having a first conductivity type, including a surface layer having a base region of the opposite conductivity type, comprising:
    an emitter and an emitter contact on said base region;
    a base contact extending through a substantial portion of said surface layer, spaced apart from said emitter contact;
    an insulator region buried under said base contact;
    a collector contact extending through said surface layer into said substrate; wherein said surface layer consists of a single layer
    a first polycrystalline semiconductor region selectively located under said insulator region,
    and a second polycrystalline semiconductor region selectively located under said collector contact, said polycrystalline regions heavily concentrated with dopants of said first conductivity type.

2. The transistor according to claim 1 wherein said semiconductor is silicon.

3. The transistor according to claim 1 wherein said surface layer comprises a semiconductor different from the semiconductor of said substrate.

4. The transistor according to claim 3 wherein said surface layer semiconductor is silicon-germanium.

5. The transistor according to claim 1 wherein said first conductivity type is n-type.

6. The transistor according to claim 1 wherein said emitter and collector contacts comprise polycrystalline semiconductor material of said first conductivity type, and said base contact comprises polycrystalline semiconductor material of opposite conductivity type.

7. The transistor according to claim 1 wherein said insulator region is aligned with said base contact.

8. The transistor according to claim 1 wherein said first polycrystalline semiconductor region is aligned with said insulator region, and said second polycrystalline semiconductor region is aligned with said collector contact.

9. The transistor according to claim 1 wherein the length of said insulator between said base contact and said buried first polycrystalline region is selected so that it reduces the base to-collector capacitance.

10. The transistor according to claim 1 wherein said first and second polycrystalline regions are selected so that they reduce the collector resistance.

* * * * *